US010607460B2

(12) United States Patent
Shamsian et al.

(10) Patent No.: US 10,607,460 B2
(45) Date of Patent: *Mar. 31, 2020

(54) SINGLE-ELEMENT DOOR/WINDOW OPENING DETECTOR

(71) Applicant: TYCO Fire & Security GMBH, Neuhausen am Rheinfall (CH)

(72) Inventors: Roni Shamsian, Holon (IL); Max Drankovsky, Ashkelon (IL); Alexander Shapira, Petach Tikva (IL)

(73) Assignee: TYCO FIRE & SECURITY GMBH, Rheinfall (CH)

( * ) Notice: Subject to any disclaimer, the term of this patent is extended or adjusted under 35 U.S.C. 154(b) by 0 days.

This patent is subject to a terminal disclaimer.

(21) Appl. No.: 16/428,200

(22) Filed: May 31, 2019

(65) Prior Publication Data
US 2019/0304270 A1    Oct. 3, 2019

Related U.S. Application Data

(63) Continuation of application No. 15/677,755, filed on Aug. 15, 2017, now Pat. No. 10,373,454.

(51) Int. Cl.
*G08B 13/08* (2006.01)
*G01D 5/24* (2006.01)
(Continued)

(52) U.S. Cl.
CPC .............. *G08B 13/08* (2013.01); *G01B 7/023* (2013.01); *G01D 5/2405* (2013.01); *G01V 3/12* (2013.01);
(Continued)

(58) Field of Classification Search
CPC ........ G08B 13/08; G08B 7/023; G08B 13/24; G01D 5/2405; G01V 3/12; H03B 28/00; H04B 1/0458; H04B 1/38
See application file for complete search history.

(56) References Cited

U.S. PATENT DOCUMENTS 8,659,428 B2    2/2014 Soto et al.
2005/0237198 A1* 10/2005 Waldner ............. G06K 19/0707
                                                                340/572.7
(Continued)

FOREIGN PATENT DOCUMENTS

GB    1 603 376 A    11/1981
JP    H05-281172 A   10/1993
(Continued)

OTHER PUBLICATIONS

International Search Report and Written Opinion both dated Oct. 18, 2018, which issued during the prosecution of International Application No. PCT/IL2018/050817.
(Continued)

*Primary Examiner* — Phung Nguyen
(74) *Attorney, Agent, or Firm* — Arent Fox LLP

(57) ABSTRACT

A door/window opening detector including an antenna having at least a first resonant frequency and a second resonant frequency associated therewith, the second resonant frequency being different from the first resonant frequency, the antenna having the first resonant frequency when in proximity to a door/window having a given dielectric constant and the second resonant frequency when not in proximity to a door/window having the given dielectric constant, and an alarm indication generator operable, in response to receiving an indication that a resonant frequency of the antenna has changed from the first resonant frequency to the second resonant frequency, for generating an alarm indication of opening of the door/window.

20 Claims, 3 Drawing Sheets

(51) Int. Cl.
   *H04B 1/04* (2006.01)
   *H04B 17/10* (2015.01)
   *G01B 7/02* (2006.01)
   *G01V 3/12* (2006.01)
   *G08B 13/24* (2006.01)
   *H03B 28/00* (2006.01)
   *H04B 1/38* (2015.01)
   *H04B 17/27* (2015.01)
   *G01S 13/00* (2006.01)
   *G01S 13/04* (2006.01)

(52) U.S. Cl.
   CPC ............ *G08B 13/24* (2013.01); *H03B 28/00* (2013.01); *H04B 1/0458* (2013.01); *H04B 1/38* (2013.01); *H04B 17/103* (2015.01); *G01S 13/00* (2013.01); *G01S 13/04* (2013.01); *H04B 17/27* (2015.01)

(56) References Cited

U.S. PATENT DOCUMENTS

| | | | |
|---|---|---|---|
| 2006/0055534 A1* | 3/2006 | Fergusson | G01D 5/2405 340/562 |
| 2010/0026482 A1* | 2/2010 | Grichener | B64D 29/06 340/539.1 |
| 2010/0225482 A1 | 9/2010 | Kasai et al. | |
| 2012/0182147 A1 | 7/2012 | Forster | |
| 2013/0057252 A1 | 3/2013 | Kang | |
| 2015/0178529 A1* | 6/2015 | Theurer | G06K 7/10366 340/10.1 |
| 2015/0179053 A1* | 6/2015 | Good | A61B 5/6892 340/539.15 |
| 2016/0077029 A1 | 3/2016 | Dempster et al. | |
| 2018/0190092 A1 | 7/2018 | Shapira et al. | |

FOREIGN PATENT DOCUMENTS

| | | |
|---|---|---|
| WO | WO 2016060938 A2 | 4/2016 |
| WO | WO 2016/187283 A1 | 11/2016 |
| WO | WO 2017/183843 A1 | 10/2017 |

OTHER PUBLICATIONS

Feb. 28, 2017 Search Report issued in Great Britain Patent Application No. 1700938.2.

* cited by examiner

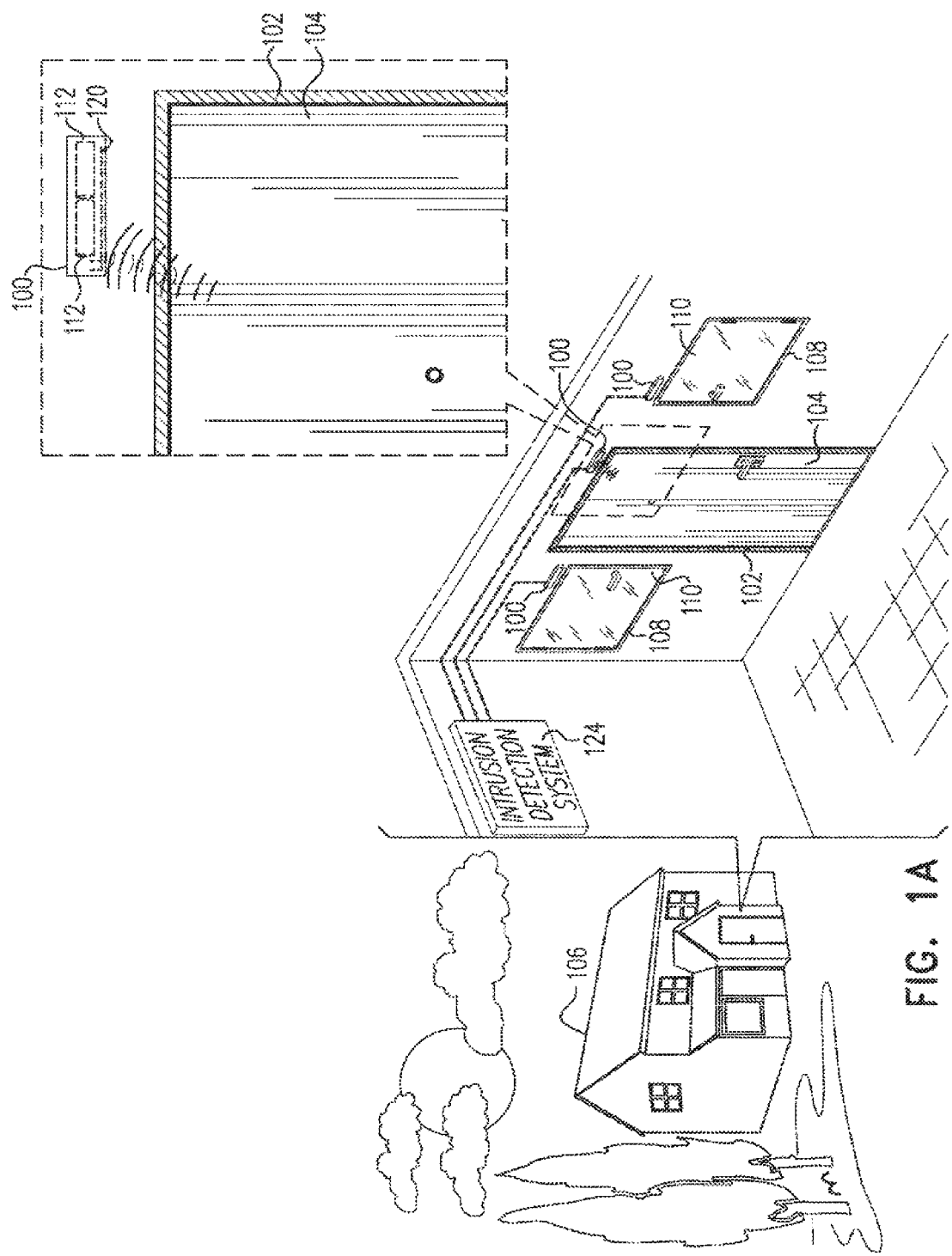

SINGLE-ELEMENT DOOR/WINDOW OPENING DETECTOR

CROSS-REFERENCE TO RELATED APPLICATIONS

This application is a Continuation of U.S. patent application Ser. No. 15/677,755, now U.S. Pat. No. 10,373,454, titled "SINGLE-ELEMENT DOOR/WINDOW OPENING DETECTOR," filed on Aug. 15, 2017, the entirety of which is incorporated herein by reference.

FIELD OF THE INVENTION

The present invention relates generally to door/window opening detector elements and to single-element door/window opening detectors in particular.

BACKGROUND OF THE INVENTION

Commercially available door/window opening detector elements typically comprise two elements: a fixed sensor element mounted on the door/window frame and a fixed magnetic element mounted on the door/window, wherein detection of opening of the door/window is typically achieved by sensing the intensity of the magnetic field generated by the magnetic element mounted on the door/window by the sensor element mounted on the door/window frame. An intensity of the magnetic field which is lower than a pre-calibrated value is typically indicative of opening of the door/window.

The aforementioned arrangement requires a system comprising the installation of two elements, thereby increasing the complexity and cost associated with implementation of the system. There, therefore, arises a need for a single-element door/window opening detector.

SUMMARY OF THE INVENTION

The present invention seeks to provide a single-element door/window opening detector. There is thus provided in accordance with a preferred embodiment of the present invention an article proximity indicator including an antenna having at least a first resonant frequency and a second resonant frequency associated therewith, the second resonant frequency being different from the first resonant frequency, the antenna having the first resonant frequency when in proximity to an article having a given dielectric constant and the second resonant frequency when not in proximity to the article having the given dielectric constant, and a proximity indication generator operable, in response to receiving an indication that a resonant frequency of the antenna has changed from the first resonant frequency to the second resonant frequency, for generating an indication indicating that the antenna is not in proximity to the article.

Preferably, the article proximity indicator also includes a high frequency oscillator operable for generating a high frequency oscillating electromagnetic signal for excitation of the antenna. Preferably, the article proximity indicator also includes a high frequency coupler coupled to the high frequency oscillator and to the antenna and operable for transmitting the high frequency oscillating electromagnetic signal generated by the high frequency oscillator to the antenna, the antenna being operable for radiating the high frequency oscillating electromagnetic signal, and for receiving, from the antenna, a reflected electromagnetic signal, reflected to the antenna responsive to radiating the high frequency oscillating electromagnetic signal.

Preferably, the article proximity indicator also includes a high-frequency detector communicating with the high frequency coupler and operable for receiving the reflected electromagnetic signal from the high frequency coupler and for generating a direct electrical current corresponding to an intensity of the reflected electromagnetic signal. Preferably, the article proximity indicator also includes an analog to digital converter communicating with the high-frequency detector and operable for receiving the direct electrical current corresponding to the intensity of the reflected electromagnetic signal from the high-frequency detector and for converting the direct electrical current into a digital value corresponding to the intensity of the reflected electromagnetic signal.

Preferably, the proximity indication generator is also operable for receiving the digital value from the analog to digital converter and for ascertaining, based on the digital value corresponding to the intensity of the reflected electromagnetic signal, whether the resonant frequency of the antenna has changed from the first resonant frequency to the second resonant frequency.

There is thus further provided in accordance with another preferred embodiment of the present invention an article proximity detection method including receiving an indication of a measurement of a resonant frequency of an antenna, the antenna having at least a first resonant frequency and a second resonant frequency associated therewith, the second resonant frequency being different from the first resonant frequency, the antenna having the first resonant frequency when in proximity to an article having a given dielectric constant and having the second resonant frequency when not in proximity to the article having the given dielectric constant, and in response to receiving an indication that a resonant frequency of the antenna has changed from the first resonant frequency to the second resonant frequency, for generating an indication that the antenna is not in proximity to the article.

Preferably, the method also includes generating a high frequency oscillating electromagnetic signal for excitation of the antenna. Preferably, the method also includes transmitting the high frequency oscillating electromagnetic signal to the antenna, the antenna being operable for radiating the high frequency oscillating electromagnetic signal.

Preferably, the method also includes receiving, from the antenna, a reflected electromagnetic signal, reflected to the antenna responsive to the radiating the high frequency oscillating electromagnetic signal. Preferably, the method also includes generating a direct electrical current corresponding to an intensity of the reflected electromagnetic signal.

Preferably, the method also includes converting the direct electrical current into a digital value corresponding to the intensity of the reflected electromagnetic signal. Preferably, the method also includes ascertaining, based on the digital value corresponding to the intensity of the reflected electromagnetic signal, whether the resonant frequency of the antenna has changed from the first resonant frequency to the second first resonant frequency.

There is yet further provided in accordance with another preferred embodiment of the present invention a door/window opening detector including an antenna having at least a first resonant frequency and a second resonant frequency associated therewith, the second resonant frequency being different from the first resonant frequency, the antenna having the first resonant frequency when in proximity to a door/window having a given dielectric constant and the second resonant frequency when not in proximity to a door/window having the given dielectric constant, and an alarm indication generator operable, in response to receiving an indication that a resonant frequency of the antenna has changed from the first resonant frequency to the second resonant frequency, for generating an alarm indication of opening of the door/window.

Preferably, the door/window opening detector also includes a high frequency oscillator operable for generating a high frequency oscillating electromagnetic signal for excitation of the antenna. Preferably, the door/window opening detector also includes a high frequency coupler coupled to the high frequency oscillator and to the antenna and operable for transmitting the high frequency oscillating electromagnetic signal generated by the high frequency oscillator to the antenna, the antenna being operable for radiating the high frequency oscillating electromagnetic signal, and for receiving, from the antenna, a reflected electromagnetic signal, reflected to the antenna responsive to radiating the high frequency oscillating electromagnetic signal.

Preferably, the door/window opening detector also includes a high-frequency detector communicating with the high frequency coupler and operable for receiving the reflected electromagnetic signal from the high frequency coupler and for generating a direct electrical current corresponding to an intensity of the reflected electromagnetic signal. Preferably, the door/window opening detector also includes an analog to digital converter communicating with the high-frequency detector and operable for receiving the direct electrical current corresponding to the intensity of the reflected electromagnetic signal from the high-frequency detector and for converting the direct electrical current into a digital value corresponding to the intensity of the reflected electromagnetic signal.

Preferably, the alarm indication generator is also operable for receiving the digital value from the analog to digital converter, and for ascertaining, based on the digital value corresponding to the intensity of the reflected electromagnetic signal, whether the resonant frequency of the antenna has changed from the first resonant frequency to the second resonant frequency. Preferably, the alarm indication generator is also operable for transmitting the alarm indication of the opening of the door/window to a premises monitoring system operable for monitoring a premises of the door/window.

There is yet further provided in accordance with yet another preferred embodiment of the present invention a door/window opening detection method including receiving an indication of a measurement of a resonant frequency of an antenna, the antenna having at least a first resonant frequency and a second resonant frequency associated therewith, the second resonant frequency being different from the first resonant frequency, the antenna having the first resonant frequency when in proximity to a door/window having a given dielectric constant and having the second resonant frequency when not in proximity to the door/window having the given dielectric constant, and in response to receiving an indication that a resonant frequency of the antenna has changed from the first resonant frequency to the second resonant frequency, generating an alarm indication of opening of the door/window.

Preferably, the method also includes generating a high frequency oscillating electromagnetic signal for excitation of the antenna. Preferably, the method also includes transmitting the high frequency oscillating electromagnetic signal to the antenna, the antenna being operable for radiating the high frequency oscillating electromagnetic signal.

Preferably, the method also includes receiving, from the antenna, a reflected electromagnetic signal, reflected to the antenna responsive to the radiating the high frequency oscillating electromagnetic signal. Preferably, the method also includes generating a direct electrical current corresponding to an intensity of the reflected electromagnetic signal.

Preferably, the method also includes converting the direct electrical current into a digital value corresponding to the intensity of the reflected electromagnetic signal. Preferably, the method also includes ascertaining, based on the digital value corresponding to the intensity of the reflected electromagnetic signal, whether the resonant frequency of the antenna has changed from the first resonant frequency to the second resonant frequency.

Preferably, the method also includes transmitting the alarm indication of the opening of the door/window to a premises monitoring system operable for monitoring a premises of the door/window.

BRIEF DESCRIPTION OF THE DRAWINGS

The present invention will be understood and appreciated more fully from the following detailed description, taken in conjunction with the drawings in which:

FIGS. 1A and 1B are simplified illustrations of a single-element door/window opening detector, constructed and operative in accordance with a preferred embodiment of the present invention.

DETAILED DESCRIPTION OF PREFERRED EMBODIMENTS

Figure 1B:
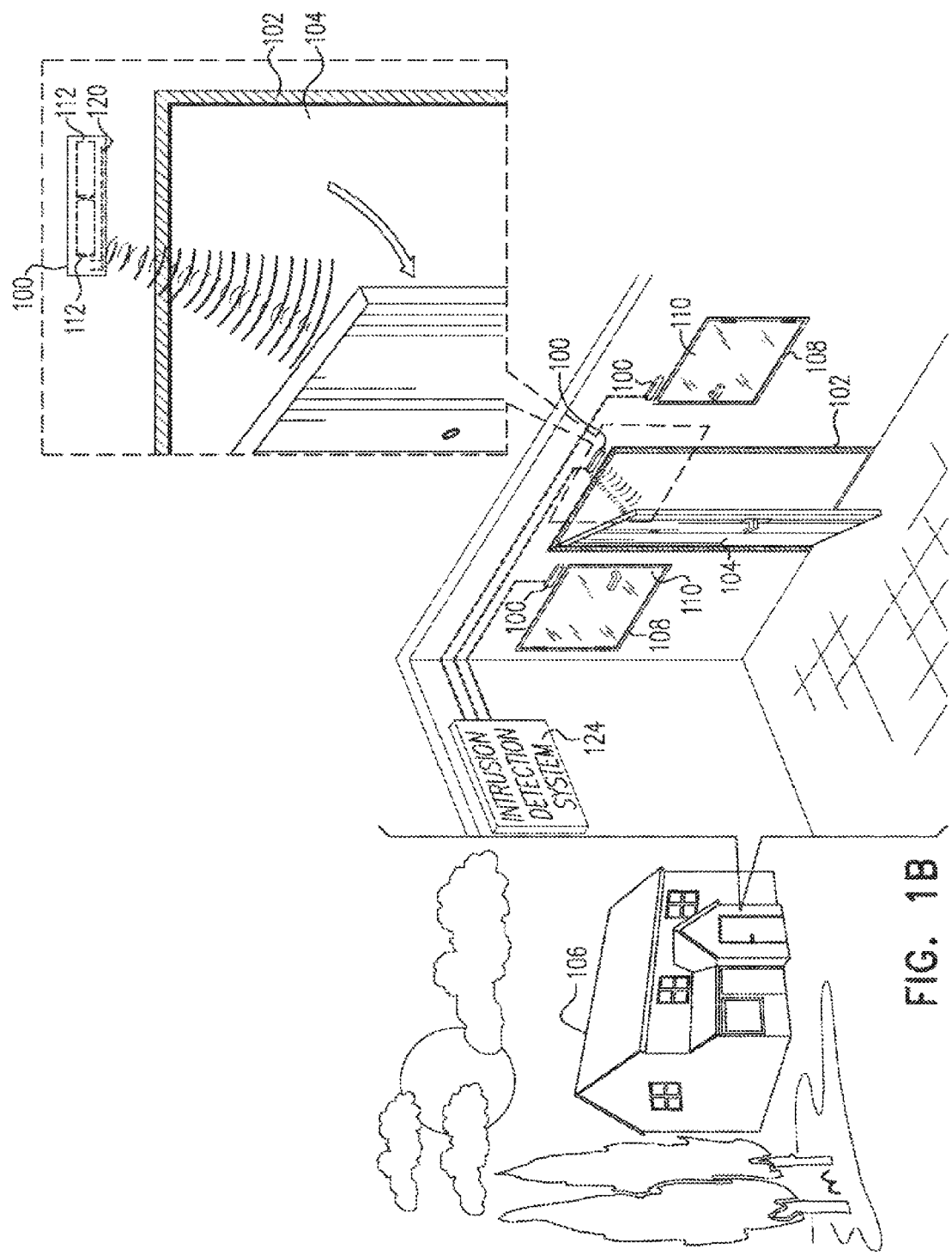

Reference is now made to FIGS. 1A and 1B, which are simplified illustrations of a single-element door/window opening detector, constructed and operative in accordance with a preferred embodiment of the present invention.

As shown in FIGS. 1A and 1B, there is provided a single-element door/window opening detector 100 which is preferably mounted, for example, on a frame 102 of a door 104 of premises 106, thereby being positioned to detect opening of door 104. As further shown in FIG. A, door/window opening detector 100 may be alternatively mounted on a frame 108 of window 110 of premises 106, thereby being positioned to detect opening of window 110. It is appreciated that door 104 and window 110 are each made of a material having a corresponding given dielectric constant. Single-element door/window opening detector 100 is preferably powered by a power source such as, for example, one or more batteries 112.

As further shown in FIGS. 1A and 1B, single-element door/window opening detector 100 preferably includes an antenna 120. Antenna 120 is preferably a quarter wavelength, inverted-F type antenna having at least a first resonant frequency when in proximity to door 104 made of a material having a given dielectric constant and a second resonant frequency when not in proximity to door 104.

It is appreciated that the resonant frequency of an antenna typically corresponds to the intensity of power reflected to the antenna by objects residing in the immediate vicinity of the antenna. It is further appreciated that the intensity of power reflected to an antenna by objects residing in the immediate vicinity of the antenna typically corresponds to the dielectric constant of the material comprising the reflecting objects in the immediate vicinity of the antenna.

In particular, in the case illustrated in FIG. 1A where door 104 is closed and is in proximity to antenna 120 of detector 100. the intensity of the power reflected by closed door 104 back to antenna 120 is greater than the intensity of the power reflected by closed door 104 back to antenna 120 in the case illustrated in FIG. 1B where door 104 is opened and is not in proximity to antenna 120 of detector 100.

It is therefore a particular feature of the present invention that by measuring an intensity of power reflected back to antenna 120, single-element door/window opening detector 100 is operable for ascertaining changes in proximity of an object having a particular dielectric constant to antenna 120, such as the proximity of door 104 to single-element door/window opening detector 100 mounted on frame 102, thereby ascertaining whether door 104 is open or closed. Single-element door/window opening detector 100 is preferably operable for communicating an alarm indication of opening of door 104 to a suitable intrusion detection system 124. It is appreciated that single-element door/window opening detector 100 may communicate with intrusion detection system 124 by wired or wireless communication.

Figure 2:
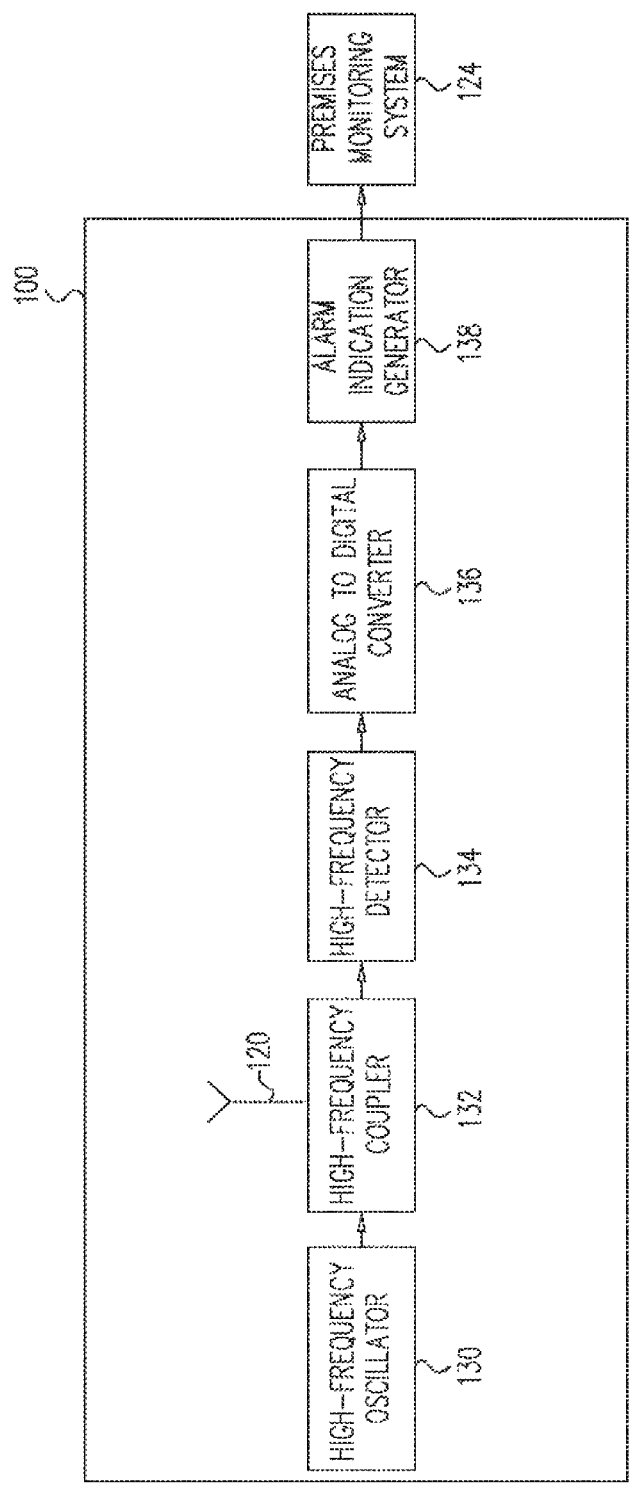
FIG. 2 is a simplified block diagram illustration of the single-element door/window opening detector of FIGS. 1A and 1B.

Reference is now made to FIG. 2, which is a simplified block diagram illustration of the single-element door/window opening detector of FIGS. 1A and 1B. As described hereinabove with reference to FIGS. 1A and 1B, single-element door/window opening detector 100 is preferably mounted, for example, on a frame of a door or of a window of a premises, thereby being positioned to detect opening of the door or of the window. It is appreciated that, typically, a door and a window are each made of a material having a corresponding given dielectric constant.

As further described hereinabove, single-element door/window opening detector 100 preferably includes an antenna 120. Antenna 120 is preferably a quarter wavelength, inverted-F type antenna. It is appreciated that antenna 120 preferably has a first resonant frequency when in proximity to a door made of a material having a given dielectric constant and a second resonant frequency when not in proximity to the door.

It is a particular feature of the present invention that single-element door/window opening detector 100 is operable, responsive to detecting changes in the resonant frequency of antenna 120, for ascertaining changes in proximity of single-element door/window opening detector 100 to a door and thereby for ascertaining that the door has been opened.

Single-element door/window opening detector 100 also preferably includes a high frequency oscillator 130 operable for generating a high frequency oscillating electromagnetic signal for excitation of antenna 120. A high frequency coupler 132 is preferably provided for transmitting the high frequency oscillating electromagnetic signal generated by high frequency oscillator 130 to antenna 120 and for receiving, from antenna 120, a reflected electromagnetic signal reflected to antenna 120 responsive to radiating the high frequency oscillating electromagnetic signal.

A high-frequency detector 134 communicating with high frequency coupler 132 is preferably operable for receiving the reflected electromagnetic signal from high frequency coupler 132 and for generating a direct electrical current corresponding to an intensity of the reflected electromagnetic signal.

An analog to digital converter 136 is preferably provided for receiving the direct electrical current from high-frequency detector 134 and for converting the direct electrical current into a digital value corresponding to the intensity of the reflected electromagnetic signal.

Single-element door/window opening detector 100 also preferably includes an alarm indication generator 138 which is preferably operable for receiving the digital value from analog to digital converter 136 and for ascertaining, based on the digital value corresponding to the intensity of the reflected electromagnetic signal, whether the resonant frequency of antenna 120 has changed from the first resonant frequency to the second resonant frequency, and that, therefore, antenna 120 is not in proximity to the door or window of the premises.

As described hereinabove, it is appreciated that the resonant frequency of an antenna typically corresponds to the intensity of power reflected to the antenna by objects residing in the immediate vicinity of the antenna. It is further appreciated that the intensity of power reflected to an antenna by objects residing in the immediate vicinity of the antenna typically corresponds to the dielectric constant of the material comprising the reflecting objects in the immediate vicinity of the antenna.

It is therefore a particular feature of the present invention that by measuring an intensity of power reflected back to antenna 120, single-element door/window opening detector 100 is operable for ascertaining changes in proximity of an object having a particular dielectric constant to antenna 120, such as the proximity of a door to single-element door/window opening detector 100 mounted on a frame, thereby ascertaining whether the door 104 is open or closed.

Alarm indication generator 138 is preferably also operable for communicating an alarm indication of opening of the door to a suitable intrusion detection system 124. It is appreciated that single-element door/window opening detector 100 may communicate with intrusion detection system 124 by wired or wireless communication.

It will be appreciated by persons skilled in the art that the present invention is not limited by what has been particularly shown and described hereinabove. Rather the scope of the present invention includes both combinations and subcombinations of the various features described hereinabove as well as modifications thereof which would occur to persons skilled in the art upon reading the foregoing description and which are not in the prior art.

The invention claimed is:

1. An article proximity indicator, comprising:
   an antenna having a first resonant frequency when in a proximity to an article with a given dielectric constant and having a second resonant frequency when not in the proximity to the article;
   a high-frequency detector operable for generating a direct electrical current corresponding to an intensity of a reflected electromagnetic signal received from the antenna;
   an analog to digital converter operable for converting the direct electrical current received from the high-frequency detector into a digital value corresponding to the intensity of the reflected electromagnetic signal; and
   a proximity indication generator operable for:
      ascertaining, based on the digital value received from the analog to digital converter, whether a resonant frequency of the antenna has changed from the first resonant frequency to the second resonant frequency; and
      generating, in response to the resonant frequency having changed from the first resonant frequency to the second resonant frequency, an indication indicating that the antenna is not in the proximity to the article.

2. The article proximity indicator of claim 1, further comprising:
a high-frequency oscillator operable for generating a high-frequency oscillating electromagnetic signal for excitation of the antenna.

3. The article proximity indicator of claim 2, further comprising:
a high-frequency coupler coupled to the high-frequency oscillator and to the antenna and operable for transmitting the high-frequency oscillating electromagnetic signal to the antenna, the antenna being operable for radiating the high-frequency oscillating electromagnetic signal.

4. The article proximity indicator of claim 3, wherein the high-frequency coupler is further operable for receiving, from the antenna, the reflected electromagnetic signal reflected to the antenna responsive to the antenna radiating the high-frequency oscillating electromagnetic signal.

5. The article proximity indicator of claim 4, wherein the high-frequency detector is further operable for receiving the reflected electromagnetic signal from the high-frequency coupler.

6. An article proximity detection method, comprising:
generating a direct electrical current corresponding to an intensity of a reflected electromagnetic signal received from an antenna having a first resonant frequency when in a proximity to an article with a given dielectric constant and having a second resonant frequency when not in the proximity to the article;
converting the direct electrical current into a digital value corresponding to the intensity of the reflected electromagnetic signal;
ascertaining, based on the digital value, whether a resonant frequency of the antenna has changed from the first resonant frequency to the second resonant frequency; and
generating, in response to the resonant frequency having changed from the first resonant frequency to the second resonant frequency, an indication indicating that the antenna is not in the proximity to the article.

7. The article proximity detection method of claim 6, further comprising:
generating a high-frequency oscillating electromagnetic signal for excitation of the antenna.

8. The article proximity detection method of claim 7, further comprising:
transmitting the high-frequency oscillating electromagnetic signal to the antenna, the antenna being operable for radiating the high-frequency oscillating electromagnetic signal.

9. The article proximity detection method of claim 8, further comprising:
receiving, from the antenna, the reflected electromagnetic signal reflected to the antenna responsive to the antenna radiating the high-frequency oscillating electromagnetic signal.

10. A door/window opening detector, comprising:
an antenna having a first resonant frequency when in a proximity to a door/window with a given dielectric constant and having a second resonant frequency when not in the proximity to the door/window;
a high-frequency detector operable for generating a direct electrical current corresponding to an intensity of a reflected electromagnetic signal received from the antenna;
an analog to digital converter operable for converting the direct electrical current received from the high-frequency detector into a digital value corresponding to the intensity of the reflected electromagnetic signal; and
an alarm indication generator operable for:
ascertaining, based on the digital value received from the analog to digital converter, whether a resonant frequency of the antenna has changed from the first resonant frequency to the second resonant frequency; and
generating, in response to the resonant frequency having changed from the first resonant frequency to the second resonant frequency, an alarm indication of an opening of the door/window.

11. The door/window opening detector of claim 10, further comprising:
a high-frequency oscillator operable for generating a high-frequency oscillating electromagnetic signal for excitation of the antenna.

12. The door/window opening detector of claim 11, further comprising:
a high-frequency coupler coupled to the high-frequency oscillator and to the antenna and operable for transmitting the high-frequency oscillating electromagnetic signal to the antenna, the antenna being operable for radiating the high-frequency oscillating electromagnetic signal.

13. The door/window opening detector of claim 12, wherein the high-frequency coupler is further operable for receiving, from the antenna, the reflected electromagnetic signal reflected to the antenna responsive to the antenna radiating the high-frequency oscillating electromagnetic signal.

14. The door/window opening detector of claim 13, wherein the high-frequency detector is further operable for receiving the reflected electromagnetic signal from the high-frequency coupler.

15. The door/window opening detector of claim 10, wherein the alarm indication generator is further operable for transmitting the alarm indication to a premises monitoring system operable for monitoring a premises of the door/window.

16. A door/window opening detection method, comprising:
generating a direct electrical current corresponding to an intensity of a reflected electromagnetic signal received from an antenna having a first resonant frequency when in a proximity to a door/window with a given dielectric constant and having a second resonant frequency when not in the proximity to the door/window;
converting the direct electrical current into a digital value corresponding to the intensity of the reflected electromagnetic signal;
ascertaining, based on the digital value, whether a resonant frequency of the antenna has changed from the first resonant frequency to the second resonant frequency; and
generating, in response to the resonant frequency having changed from the first resonant frequency to the second resonant frequency, an alarm indication of an opening of the door/window.

17. The door/window opening detection method of claim 16, further comprising:
generating a high-frequency oscillating electromagnetic signal for excitation of the antenna.

18. The door/window opening detection method of claim 17, further comprising:
   transmitting the high-frequency oscillating electromagnetic signal to the antenna, the antenna being operable for radiating the high-frequency oscillating electromagnetic signal.

19. The door/window opening detection method of claim 18, further comprising:
   receiving, from the antenna, the reflected electromagnetic signal reflected to the antenna responsive to the antenna radiating the high-frequency oscillating electromagnetic signal.

20. The door/window opening detection method of claim 19, further comprising:
   transmitting the alarm indication to a premises monitoring system operable for monitoring a premises of the door/window.

\* \* \* \* \*